United States Patent [19]

Jacobson et al.

[11] Patent Number: 5,392,244
[45] Date of Patent: Feb. 21, 1995

[54] MEMORY SYSTEMS WITH DATA STORAGE REDUNDANCY MANAGEMENT

[75] Inventors: Michael B. Jacobson; John W. Fordemwalt; Douglas L. Voigt; Marvin D. Nelson, all of Boise, Id.; Hamid Vazire, Palo Alto; Robert Baird, San Jose, both of Calif.

[73] Assignee: Hewlett-Packard Company, Palo Alto, Calif.

[21] Appl. No.: 109,137

[22] Filed: Aug. 19, 1993

[51] Int. Cl.⁶ .................. G06F 11/00; G06F 15/02
[52] U.S. Cl. ...................... 365/200; 395/425; 395/275; 395/725; 371/10.1; 371/21.1; 371/40.1
[58] Field of Search ............... 365/201, 200; 371/10.1, 371/21.1, 40.1; 395/425, 275, 725, 200

[56] References Cited

U.S. PATENT DOCUMENTS

| | | | |
|---|---|---|---|
| 5,155,835 | 10/1992 | Belsan | 395/425 |
| 5,195,100 | 3/1993 | Katz et al. | 371/66 |
| 5,237,658 | 8/1993 | Walker et al. | 395/200 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,297,258 | 3/1994 | Hale et al. | 395/275 |

Primary Examiner—Viet Q. Nguyen

[57] ABSTRACT

A disk array has a plurality of disks, a disk array controller for coordinating data transfer to and from the disks, and a RAID management system for mapping two different RAID areas onto the disks. The RAID management system stores data in one of the RAID areas according to mirror redundancy, and stores data in the other RAID area according to parity redundancy. The RAID management system then shifts or migrates data between the mirror and parity RAID areas on the disks in accordance with a predefined performance protocol, such as data access recency or access frequency.

11 Claims, 3 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T−1 | T−1' | T | T' | S |

FIG. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R−2 | R−1 | R | Q |

FIG. 3

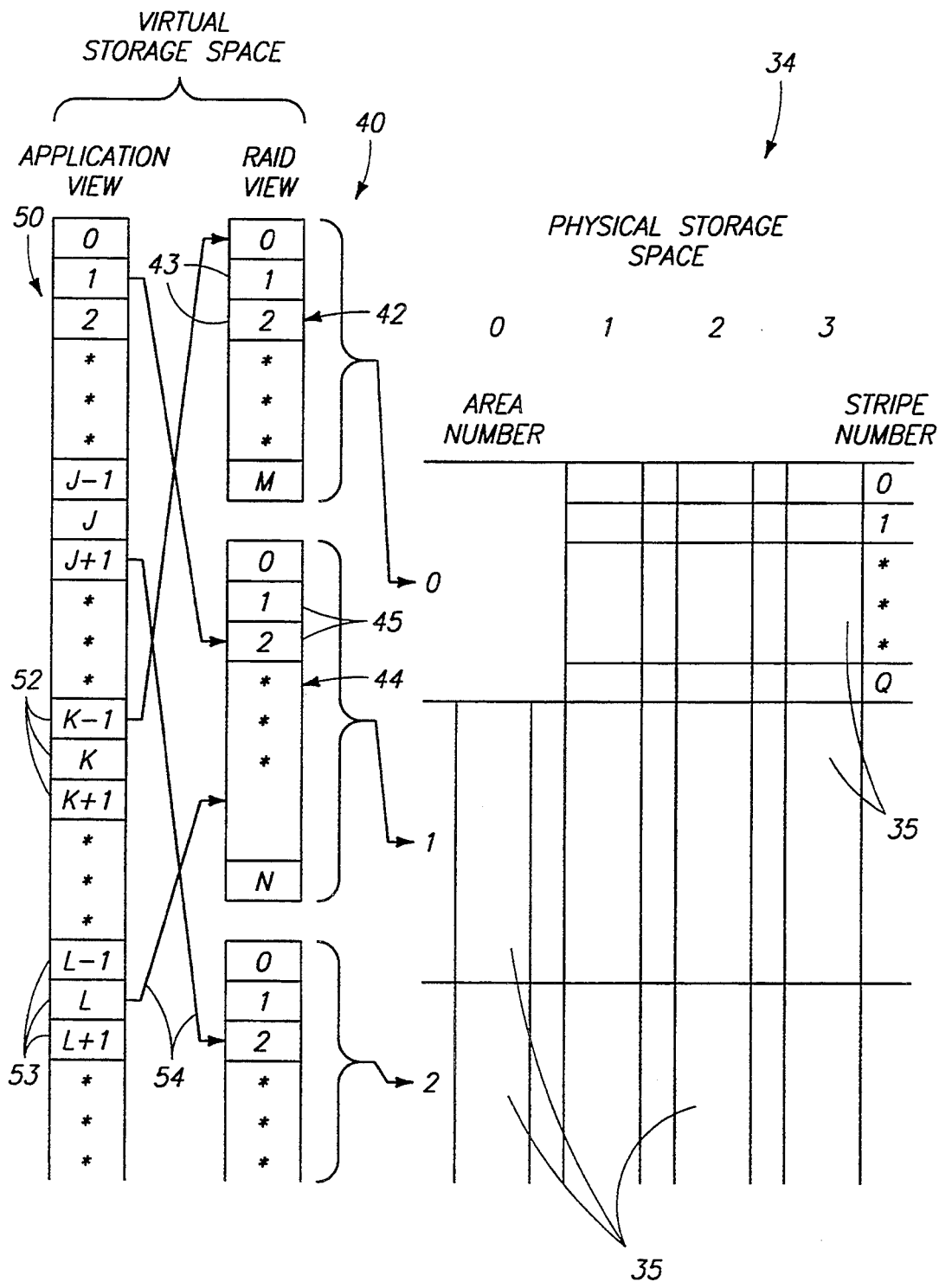

MEMORY SYSTEMS WITH DATA STORAGE REDUNDANCY MANAGEMENT

FIELD OF THE INVENTION

This invention relates to non-volatile memory systems with the capability of detecting failures, such as computer disk arrays, having data storage redundancy management.

BACKGROUND OF THE INVENTION

Computer systems are constantly improving in terms of speed, reliability, and processing capability. As a result, computers are able to handle more complex and sophisticated applications. However, as computers improve, performance demands placed on mass storage and input/output (I/O) devices increase. In general, I/O performance has had difficulty keeping pace with the growing capabilities of the computers.

The mass storage industry faces two primary challenges: (1) to improve I/O performance so that data access does not become a limiting factor for an application, and (2) to provide access to on-line data at levels of reliability well in excess of the expected lifetimes of the computer systems that process it. See, *The RAIDBook: A Source Book for RAID Technology*, published Jun. 9, 1993, by the RAID Advisory Board, Lino Lakes, Minn. It is desirable that storage devices meet these goals in a cost-effective manner.

The performance of present disk I/O systems is limited because data stored thereon is located by comparatively slow processes of seeking and disk rotation. Additionally, the data is transferred to and from the disk media in a serial bit stream which also inhibits speed. Manufacturers, therefore, attempt to design systems which rearrange data on the disks in such a manner that the more frequently accessed data is evenly distributed across the I/O resources.

There are three primary design criteria for mass storage systems: cost, performance, and availability. It is most desirable to produce memory devices that have a low cost per megabit, a high input/output performance, and high data availability. "Availability" is the ability to recover data stored in the storage system even though some of the data has become inaccessible due to failure or some other reason and the ability to insure continued operation in the event of such failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

The present invention provides a memory system which achieves the three desired attributes of high performance, high data availability, and low cost.

SUMMARY OF THE INVENTION

According to this invention, a memory system comprises a non-volatile memory device having a first memory location which stores data according to a first redundancy level (such as mirror redundancy), and a second memory location that stores data according to a second redundancy level (such as parity redundancy). The memory system further includes manager means for transferring data between the first and second memory locations based upon a defined performance protocol for a particular data (such as a migration policy which employs data access recency or data access frequency).

This invention also concerns a method for managing data on a disk array which includes the following steps: (1) providing physical storage space on a plurality of disks; (2) mapping the physical storage space into a virtual storage space having multiple first and second areas; (3) storing data in the first areas according to a first redundancy level; (4) storing data in the second areas according to a second redundancy level; and (5) migrating data from a first area of the virtual storage space to a second area of the virtual storage space.

DESCRIPTION OF THE DRAWINGS

Preferred embodiments of the invention are described below with reference to the following accompanying drawings depicting examples embodying the best mode for practicing the invention.

FIG. 2 is a diagrammatic illustration showing a RAID Level 1 data storage.

FIG. 3 is a diagrammatic illustration showing a RAID Level 5 data storage.

FIG. 4 is a diagrammatic illustration of a memory mapping arrangement of this invention.

DETAILED DESCRIPTION OF THE INVENTION

Figure 1:
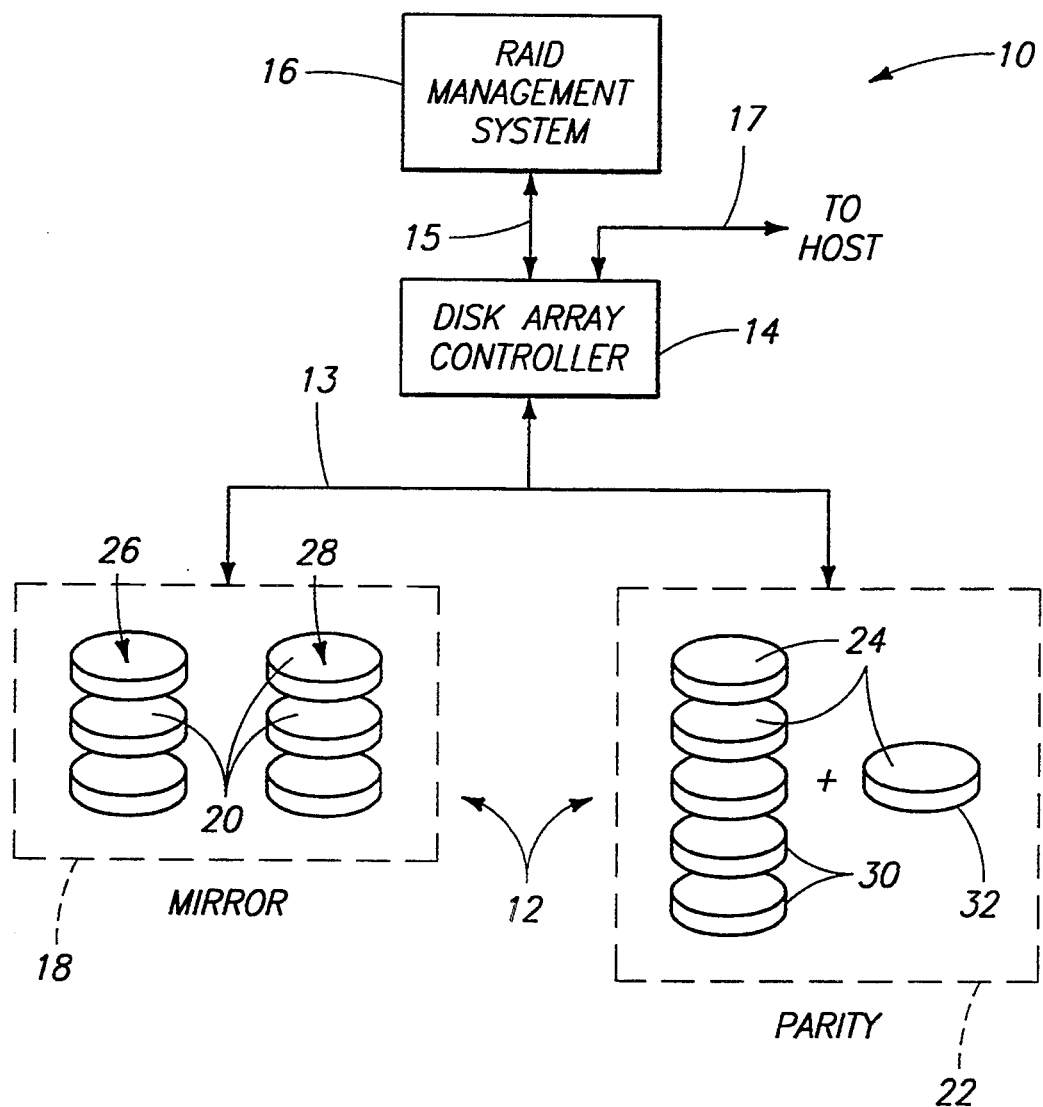
FIG. 1 is a diagrammatic block diagram of a memory system according to this invention.

This disclosure of the invention is submitted in furtherance of the constitutional purposes of the U.S. Patent Laws "to promote the progress of science and useful arts" (Article 1, Section 8).

FIG. 1 shows a memory system 10 constructed according to this invention. Preferably, memory system 10 is a disk array having a plurality of disks 12, a disk array controller 14 which coordinates data transfer to and from the disks, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware (such as a controller) required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, The *RAIDBook: A Source Book for RAID Technology*, published Jun. 9, 1993, by the RAID Advisory Board, Lino Lakes, Minn.

Disk array controller 14 is coupled to disks 12 via one or more interface buses 13, such as a small computer system interface (SCSI). RAID management system 16 is operatively coupled to disk array controller 14 via an interface protocol 15. Memory system 10 is coupled to a host computer (not shown) via an I/O interface bus 17. RAID management system 16 can be embodied as a separate component or configured within disk array controller 14 or within the host computer to provide a manager means for controlling disk storage and reliability levels, and for transferring data among various reliability storage levels. These reliability storage levels are preferably mirror or parity redundancy levels as described below, but can also include a reliability storage level with no redundancy at all.

FIG. 1 shows disks 12 arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the memory system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. Horizontal rows represent "stripes" in which data is distributed across the disks in the array. A stripe is comprised of numerous segments, with one segment being associated with each disk. In this example, data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. However, the redundant data need not be placed neatly in the same stripe as is shown. For example, data stored on disk 0 in segment 2 of stripe 1 could be duplicated and placed on disk 3 in segment T' of stripe S.

In FIG. 1, the parity group 22 of disks 24 represent a second memory location or RAID area in which data is stored according to a second redundancy level, such as RAID Level 5. In this explanatory illustration, original data is stored on the five disks 30 and redundant "parity" data is stored on the sixth disk 32.

FIG. 3 shows a parity RAID area layout in more detail. The RAID area comprises multiple disks and a number of equal sized stripes. The portion of a stripe that resides on a single disk is a segment. In this example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed with an exclusive OR function, which is represented by the symbol "$\oplus$". The parities for the first four stripes (with the subscript numeral representing the corresponding stripe) are as follows:

$P_0$ = Segment 0 $\oplus$ Segment 1 $\oplus$ Segment 2 = Disk 0 $\oplus$ Disk 1 $\oplus$ Disk 2

$P_1$ = Segment 3 $\oplus$ Segment 4 $\oplus$ Segment 5 = Disk 0 $\oplus$ Disk 1 $\oplus$ Disk 3

$P_2$ = Segment 6 $\oplus$ Segment 7 $\oplus$ Segment 8 = Disk 0 $\oplus$ Disk 2 $\oplus$ Disk 3

$P_3$ = Segment 9 $\oplus$ Segment 10 $\oplus$ Segemnt 11 = Disk 1 $\oplus$ Disk 2 $\oplus$ Disk 3

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, disk array 10 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. This feature is discussed below in more detail with reference to FIG. 4.

The memory system 10 of this invention is unique because it manages the "migration" of data between mirror and parity storage schemes. The management of both types of redundancy is coordinated by RAID management system 16 (FIG. 1). RAID management system 16 manages the two different types of RAID areas as a memory hierarchy with the mirror RAID areas acting similar to a cache for the parity RAID areas. Once data is moved from a parity RAID area to a mirror RAID area, the space it once occupied in the parity RAID area is available for storage of other data. The RAID management system 16 shifts, organizes, and otherwise manages the data between the mirror and parity RAID areas in accordance with a defined performance protocol. The process of moving data between the mirror and parity RAID areas is referred to as "migration".

Memory system 10 places the more critical data in the mirror RAID areas since this affords the highest performance and reliability. The performance protocols implemented by RAID management system 16 includes one of two preferred migration policies. According to the first migration policy, the most frequently accessed data is maintained in the mirror RAID area 18. Less frequently accessed data is maintained in the parity RAID area 22. According to a second migration policy, known as "access recency", the most recently accessed data is maintained in the mirror RAID area 18 while the remaining data is stored in parity RAID area 22. Other performance protocols may be employed. Ideally, such protocols are defined based upon the specific computer application.

In this manner, the RAID management system 16 effectively "tunes" the storage resources of a memory system according to the application or user requirements. For instance, in an application requiring high performance and reliability, the RAID management system may create and define a proportionally larger mirror RAID area, thereby dedicating a larger amount of physical storage capacity to mirror redundancy, in comparison to the parity RAID area. Conversely, in an application where cost is premium and less importance is placed on performance or reliability, the RAID management system may establish a proportionally larger parity RAID area in comparison to the mirror RAID area. Accordingly, the memory system of this invention affords maximum flexibility and adaptation.

FIG. 4 illustrates a memory mapping of the available storage space of memory system 10 as multiple tiers of mapped virtual storage space. Each rectangle in the diagram represents a view of physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. The storage space 34 is partitioned into areas 0, 1, 2, etc. Individual areas contain multiple regions 35, which are preferably equal in size across the entire disk array.

The storage space of the disks cain be mapped into a first, intermediate, or RAID-level virtual view 40 of the physical storage space 34. This first virtual view is conceptually a set of RAID areas which, when viewed by the user or application program, represents one large storage space indicative of the total storage space on the disks 0, 1, 2, and 3. Accordingly, the height of the rectangle in the RAID areas is shown as higher than those of the disks.

The RAID-level storage space 40 is the view of storage that identifies mirror and parity storage space. For instance, a RAID area 42 may represent a mirror RAID area of M allocation blocks 43 while RAID area 44 represents a parity RAID area of N allocation blocks 45. These RAID areas relate to corresponding areas 0, 1, 2, etc., on the physical storage space 34. The mirror and parity RAID areas may or may not consume the entire storage space 34 of the disk array. Accordingly, during certain applications, there may be unused and undesignated storage space that does not correspond to a particular RAID level area. However, such storage space can be converted into a mirror or parity RAID area as is described below in more detail.

The storage space available in the RAID areas can also be mapped into a second, front end, or application-level virtual view 50 which is a view of storage presented to the user or application program. When viewed by the user or application program, second virtual view 50 also represents a single large storage capacity indicative of the available storage space on disk 12. Virtual storage space 50 presents a view of a linear set of equal sized storage virtual blocks 52 and 53, referenced individually as 0, 1, 2, ... J−1, J, J+1, ..., etc. The virtual block storage space 50 is represented by a table of references or pointers to allocation blocks in the view presented by RAID areas 40 (as represented by arrows 54).

There are at least two types of RAID areas that can be referenced from the virtual block table: mirror and parity. Preferably, the allocation blocks 43 and 45 of RAID areas 40 are the same size as the virtual blocks 52 and 53 of the application-level virtual storage space 50 so that the virtual block table can reference a particular RAID area. For purposes of continuing explanation, virtual blocks 53 of the second virtual storage space 50 reference associated allocation blocks 45 in parity RAID area 44 stored in area 1 of physical storage space 34. Such virtual blocks 53 may be referred to as "parity virtual blocks" while the associated allocation blocks 45 are referred to as "parity allocation blocks" Similarly, virtual blocks 52 reference associated allocation blocks 43 in mirror RAID area 42 stored in area 0 of physical storage space 34. Such virtual blocks 52 are referred to herein as "mirror virtual blocks" while the associated allocation blocks 43 are referred to as "mirror allocation blocks".

The operation of memory system 10 will now be described with reference to FIGS. 1 and 4.

In general, to migrate data from one RAID area to another, a virtual block associated with an allocation block of a first RAID level (such as mirror or Level 1) is selected. Then, an unused allocation block representing a second RAID level (such as parity or Levels 3, 4, or 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the second virtual storage space 50 is modified and updated to reflect the shift of data.

The continuing discussion provides a more detailed explanation of migrating data between mirror and parity storage areas according to preferred methods and sequences of this invention. To migrate data from a virtual block 53 indicative of a parity allocation block 45 in parity Raid area 44 to a mirror allocation block 43 in a mirror RAID area 42, the following sequence is employed:

1. A request is made for a virtual block 53 that is currently stored as a parity allocation block 43 in a parity RAID area 44.

2. The RAID management system locates an unused mirror allocation block 43 in a mirror RAID area 42.

3. If none can be found, the RAID management system creates a mirror allocation block (discussed below).

4. The RAID management system suspends new storage requests to the virtual block to be migrated.

5. The RAID management system waits until all active data storage requests to the virtual block are completed.

6. The data from the parity allocation block 45 associated with parity virtual block 53 is read into a temporary memory buffer.

7. The data is then written to the mirror allocation block 43 chosen in step 2.

8. The virtual block table is modified to reference the new location of the data in mirror allocation block 45.

9. The suspended storage requests are resumed.

According to the above procedure, the virtual block previously associated with a parity allocation block has now become associated with a mirror allocation block, thereby essentially migrating the virtual block from parity to mirror storage. Relative to the intermediate virtual view, data has moved from parity allocation block(s) 45 in parity RAID area 44 to mirror allocation block(s) 43 in mirror RAID area 42. In physical storage space, data has migrated from area 1 to area 0.

The RAID management system 16 reserves a few RAID areas for the purpose of migration. The reserved areas are not available for the storage of client application, but serve as temporary storage locations for data being moved between the mirror and parity storage areas. These reserved RAID areas are useful during the creation of new RAID storage areas or the conversion between mirror and parity RAID areas during the migration process.

If an unused mirror allocation block cannot be located (Step 3 above), the RAID management system will attempt to create one according to the following preferred sequence of techniques. First, the RAID management system will attempt to locate an unused and undesignated RAID area that can be converted to a mirror RAID area. Second, if this proves unsuccessful, the RAID management system will next attempt to locate an unused parity allocation block and migrate a mirror virtual block to parity storage. This frees up mirror allocation blocks to receive the new data. If this second step fails, the RAID management system will then attempt to create an unused RAID area by migrating a number of mirror virtual blocks to parity storage using the reserved RAID areas. Since mirror virtual blocks occupy more physical storage space than parity virtual blocks, migration of mirror virtual blocks to parity RAID areas will result in a net increase in the amount of unused storage even if it requires conversion of a reserved RAID area to a parity RAID area. Migration of mirror blocks to parity storage will eventually result in an additional unused RAID area that can be converted to a mirror RAID area.

The creation/conversion protocol used to locate and establish unused allocation blocks is advantageous because it permits the RAID management system to selectively adjust the memory allocation between parity and mirror areas according to the computer application. As applications vary, the RAID management system employs one or more of the above three techniques to define the ideal amount of mirror storage area for specific performance and reliability requirements of the various applications.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be the same size or smaller than the available physical space 34. In this manner, the sequence of techniques will always yield an unused mirror allocation block.

To migrate a virtual block from mirror to parity storage, the following sequence is employed:

1. The RAID management system chooses a virtual block 52 to migrate from mirror to parity storage according to a migration policy such as access recency or access frequency.

2. The RAID management system locates an unused parity allocation block 45 in a parity RAID area 44.

3. If such a block cannot be found, a reserved RAID area is converted to a parity RAID area according to the above described creation techniques.

4. New storage requests to the virtual block to be migrated are suspended.

5. The RAID management system waits until all active storage requests to the virtual block are completed.

6. Data is read from the mirror allocation block 43 associated with virtual block 52 into a temporary memory buffer.

7. The data is written to the chosen parity virtual block 53.

8. The virtual block table is modified to reference a new location of the data in parity allocation block 45.

9. Data requests to the migrated virtual block are resumed. The above two sequences are provided to give examples of how the memory system of this invention can operate. Other various procedures and alternatives are possible and would be recognized by one skilled in the art.

The memory system of this invention is advantageous because it affords high performance and high data availability (i.e., reliability), while providing a relatively low storage cost. This is accomplished by extracting the benefits associated with mirror storage and parity storage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for managing data on a disk array, comprising the following steps:

providing physical storage space on a disk array of plural disks;

mapping the physical storage space into a first virtual storage space having first and second RAID areas, the first RAID area having first allocation blocks for holding data according to a first RAID level and the second RAID area having second allocation blocks for holding data according to a second RAID level;

mapping the first virtual storage space into a second virtual storage space having multiple virtual blocks, the first and second virtual blocks being associated with the first and second allocation blocks in respective RAID areas via a virtual block table;

selecting a first virtual block associated with a first allocation block in a first RAID area;

locating a second allocation block in a second RAID area;

transferring selected data from said first allocation block to said second allocation block so that the selected data once stored according to the first RAID level is now stored according to the second RAID level; and modifying the virtual block table to reflect the transfer data to the second RAID area.

2. A method for managing data on a disk array according to claim 1 wherein the first RAID level is RAID level 1 and the second RAID level is RAID level 5.

3. A method for managing data on a disk array, comprising the following steps:

providing physical storage space on a disk array of plural disks;

mapping the physical storage space into a first virtual storage space having first and second RAID areas, the first RAID areas having first allocation blocks for holding data according to a first RAID level and the second RAID areas having second allocation blocks for holding data according to a second RAID level;

mapping the first virtual storage space into a second virtual storage space having multiple blocks, the virtual blocks being associated with the first and second allocation blocks in respective first and second RAID areas via a virtual block table;

selecting a first virtual block associated with a first allocation block in a first RAID area;

creating a second allocation block in a second RAID area according to at least one of the following steps:

(a) converting an unused and undesignated RAID area into a second RAID area having multiple second allocation blocks;

(b) locating an unused allocation block in the first RAID area and migrating data from a used allocation block in a second RAID area to the unused allocation block to render the used allocation block available as the second allocation block; and (c) establishing an Unused and undesignated RAID area by migrating data in at least one allocation block in the first RAID area to an allocation block in the second RAID area, the unused and undesignated RAID area established in this step (c) then being converted to a second RAID area according to step (a);

transferring selected data from the first allocation block to the second allocation block so that the selected data once stored according to the first RAID level is now stored according to the second RAID level; and modifying the virtual block table to reflect the transfer of data to the second RAID area.

4. A method for managing data on a disk array according to claim 3 wherein the first redundancy level is RAID Level 1 and the second redundancy level is RAID Level 5.

5. A method for managing data on a disk array according to claim 3 wherein the converting step (a) is first conducted in an attempt to create the second RAID area before one of the locating step (b) and the establishing step (c) are conducted.

6. A method for managing data on a disk array according to claim 3 wherein the steps of creating the second allocation block are conducted in the following sequence: converting step (a), followed by the locating step (b), followed by the establishing step (c).

7. A method for managing data on a disk array according to claim 1 wherein the selected data being transferred from the first allocation block to the second allocation block is chosen based upon how recently that data has been accessed.

8. A method for managing data on a disk array according to claim 1 wherein the selected data being transferred form the first allocation block to the second allocation block is chosen based upon how frequently that data has been accessed.

9. A method for managing data on a disk array, comprising the following steps:

providing physical storage space on a disk array of plural disks; mapping the physical storage space into a virtual storage space having mirror and parity RAID areas, the mirror RAID areas having mirror allocation blocks for holding data according to RAID level 1 and the parity RAID area having parity allocation blocks for holding data according to a RAID level 5; and migrating data between the mirror and parity allocation blocks in the virtual storage space.

10. A method for managing data on a disk array according to claim 9 wherein the data is migrated between the mirror and parity allocation blocks based upon how recently that data has been accessed.

11. A method for managing data on a disk array according to claim 9 wherein the data is migrated between the mirror and parity allocation blocks based upon how frequently that data has been accessed.

* * * * *